(12) United States Patent
Fan

(10) Patent No.: US 6,773,964 B2
(45) Date of Patent: Aug. 10, 2004

(54) INTEGRATED CIRCUIT PACKAGE INCLUDING SEALED GAPS AND PREVENTION OF VAPOR INDUCED FAILURES AND METHOD OF MANUFACTURING THE SAME

(75) Inventor: Xuejun Fan, Croton on the Hudson, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/261,893

(22) Filed: Sep. 30, 2002

(65) Prior Publication Data

US 2004/0061127 A1 Apr. 1, 2004

(51) Int. Cl.[7] ............................................... H01L 21/50
(52) U.S. Cl. ...................... 438/122; 257/706; 257/708; 257/710
(58) Field of Search .............................. 438/122, 123, 438/125; 257/706–710

(56) References Cited

U.S. PATENT DOCUMENTS

| | | | |
|---|---|---|---|
| 4,866,506 A | 9/1989 | Nambu et al. ................. | 357/72 |
| 5,008,062 A | * 4/1991 | Anderson et al. ....... | 264/272.15 |
| 5,248,848 A | 9/1993 | Kronowski et al. ......... | 174/52.1 |
| 5,296,738 A | 3/1994 | Freyman et al. ............. | 257/684 |
| 5,767,446 A | 6/1998 | Ha et al. .................... | 174/52.4 |
| 6,014,318 A | 1/2000 | Takeda ........................ | 361/764 |
| 6,054,755 A | 4/2000 | Takamichi et al. .......... | 257/667 |
| 6,215,180 B1 | 4/2001 | Chen et al. .................. | 257/720 |
| 6,232,652 B1 | 5/2001 | Matsushima | |
| 6,358,780 B1 | 3/2002 | Smith et al. ................. | 438/127 |
| 2001/0013640 A1 | 8/2001 | Tao | |

FOREIGN PATENT DOCUMENTS

WO 9735342 A 9/1997 ........... H01L/23/00

* cited by examiner

Primary Examiner—Wael Fahmy Jr.
Assistant Examiner—Nathan W. Ha
(74) Attorney, Agent, or Firm—Peter Zawilski

(57) ABSTRACT

There exist a need in the art for an IC package that prevents the popcorn effect through every process step in forming an electronic device, as well as during operation of the device. This need is met by an integrated circuit package and a method of manufacturing an integrated circuit package which, during dispensing of an adhesive layer includes at least one via formed by dispensing the adhesive layer in a pattern such that it enables the release of vapor trapped in the integrated circuit package after the attachment of the heat spreader.

10 Claims, 6 Drawing Sheets

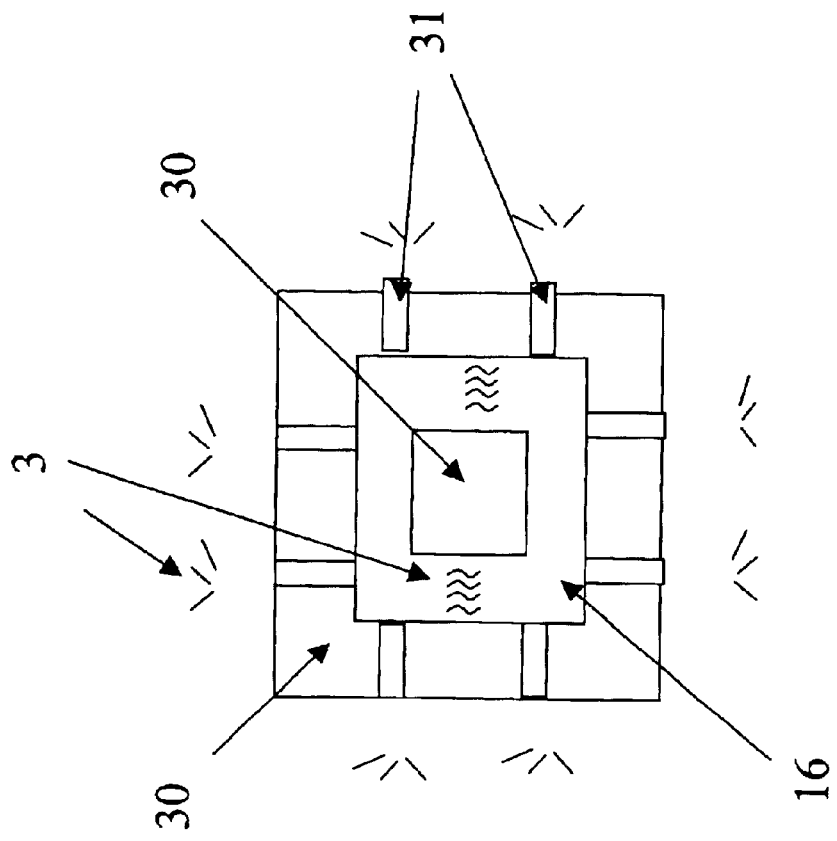
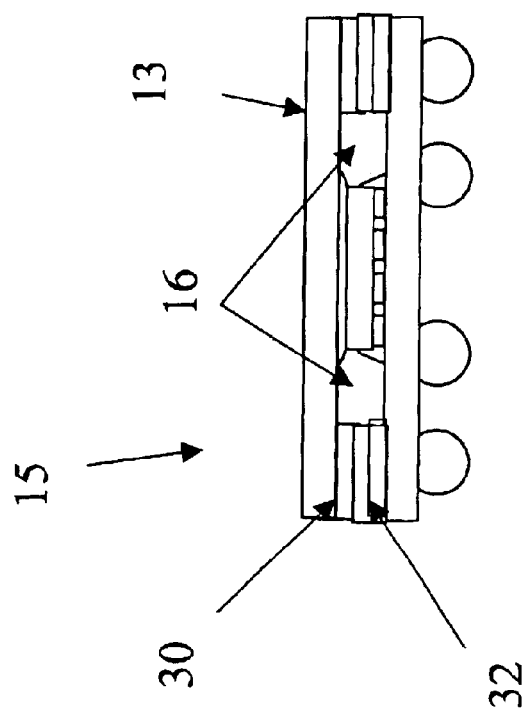
Fig. 3B
Fig. 3A

INTEGRATED CIRCUIT PACKAGE INCLUDING SEALED GAPS AND PREVENTION OF VAPOR INDUCED FAILURES AND METHOD OF MANUFACTURING THE SAME

FIELD OF THE INVENTION

The invention relates to integrated circuit (IC) electronic packages including moisture vents and methods of manufacturing such packages.

BACKGROUND OF THE INVENTION

Electronic devices utilizing semiconductor chips are mounted on substrates that physically support the chips and electrically transmit signals between the chips and other elements of the circuit. One prior art method of attaching such chips to substrates includes attaching a chip with a bumped surface to a substrate (e.g., a flip-chip), utilizing an underfilling to fasten the bumped chip to the substrate. A heat spreader is attached above the chip and the to dissipate heat generated during the operation of the electronic device. This configuration will herein be referred to as an IC package.

FIG. 1 depicts an IC package according to the prior art. Chip 10 is attached to substrate 11 (i.e., formed from flex, plastic material, etc.) with an underfilling 12. Heat spreader 13 is mounted above chip 10. IC package 15 is attached to, for example, a printed circuit board using solder balls 14. This attachment requires high temperature (e.g., 220° C. for eutectic solder, and even higher temperatures for lead-free solder), which can vaporize any trapped moisture in gaps 16 within IC package 15 and expand any gasses trapped in gaps 16 as well. Moisture trapped in gaps 16 can be the result of moistures that absorbed in plastic materials of the IC package, such as substrate 11, underfilling 12, and various adhesives.

High vapor pressure in gaps 16 may cause delamination and debonding of heat spreader 13 from IC package 15, as shown in FIG. 2. The vapor 3 trapped inside gaps 16 overcomes the mechanical bonding strength of an adhesive, which no longer holds heat spreader 13 down. The vapor 3 is then suddenly released. This is commonly referred to in the art as the "popcorn effect." The vapor pressure may also cause other failures such as the delamination and debonding between chip 10 and spreader 13, chip 10 and underfilling 12, underfilling 12 and substrate 11, as well as stiffener 32 and substrate 11.

Prior art solutions to this dilemma, such as U.S. Pat. No. 6,215,180, herein incorporated by reference, mitigate the popcorn effect by including apertures in the heat spreader layer, or in the substrate itself. Pressure buildup in the gaps is avoided because the apertures expose the vapor in the gaps to the ambient environment, thus preventing the popcorn effect. However, prior art apertures suffer from the limitation that they serve to allow vapor to escape only so long as they are exposed to the ambient environment. Often, subsequent dispensing of layers, such as adhesives or additional heat spreaders, cover or fill the apertures sealing the gaps in the IC package. As a result, remaining moisture may be heated in process steps subsequent to the gaps being sealed, and the popcorn effect may still occur.

Other prior art solutions include using a vapor permeable heat spreader and relying on mechanical strength or flexibility of a heat spreader or adhesive layer to counteract an excess of vapor pressure. Both of these techniques require costly, non-conventional heat spreader configurations and materials. Further, these prior art solutions may be subject to the popcorn effect because the vapor pressure may still exceed the permeability of the heat spreader or the interfacial mechanical strength of adhesives.

Accordingly, it would be desirable for an IC package to include a means for relieving vapor pressure which does not suffer from the prior art limitations.

SUMMARY OF THE INVENTION

The need for an IC package that prevents the popcorn effect through every process step in forming an electronic device, as well as during operation of the device is met by including, in one aspect, a method of manufacturing an integrated circuit package includes several steps. The first step is attaching a semiconductor chip to a substrate which includes stiffener. The second step includes dispensing an adhesive layer atop the stiffener. The third step includes attaching a heat spreader to the adhesive layer. In addition, the step of dispensing of the adhesive layer includes the step of generating at least one via by dispensing the adhesive layer in a pattern which permits releasing vapor trapped in the integrated circuit package after the attachment of the heat spreader.

In another embodiment, the via allows the release of vaporized moisture during solder reflow. In another embodiment, the release of vapor occurs during an initial period of solder reflow where the vapor pressure in gaps 16 exceeds the ambient vapor pressure during temperature elevation during solder reflow. In another embodiment, the release of vapor occurs continuously in the course of solder reflow.

In another embodiment, the at least one via extends laterally through the adhesive layer between the heat spreader and the stiffener. In another embodiment, the at least one via extends through the integrated circuit package to a side exterior surface of the IC package.

In another embodiment, the step of generating at least one via further includes using a stencil to create the pattern enabling the release of moisture after the attachment of the heat spreader.

In another aspect of the invention, a method of manufacturing an integrated circuit package includes several steps. The first step includes attaching a semiconductor chip to a substrate which includes stiffener. The next step includes dispensing a first adhesive layer atop the stiffener. The subsequent step includes dispensing a second adhesive layer atop the semiconductor chip, followed by a step of attaching a heat spreader to the first and second adhesive layers. In addition, the step of dispensing the first adhesive layer further includes the step of generating at least one via by dispensing the first adhesive layer in a pattern which permits releasing vapor trapped in the integrated circuit package after the attachment of the heat spreader.

In another embodiment, the first adhesive layer is a structural adhesive layer, and the second adhesive layer is a thermal adhesive layer.

In another aspect of the invention, an integrated circuit package includes a substrate which includes a stiffener, a semiconductor chip attached to the substrate, an adhesive layer atop the stiffener, and a heat spreader attached to the thermal adhesive and structural adhesive layers. In addition, the adhesive layer forms at least one via for releasing vapor.

In another aspect of the invention, an integrated circuit package includes a substrate which includes a stiffener, a semiconductor chip attached to the substrate, a first adhesive layer atop the stiffener, a second adhesive layer atop the semiconductor chip, and a heat spreader attached to the first and second adhesive layers. In addition, the first adhesive layer forms at least one via for releasing vapor.

The invention provides many advantages that are evident from the following description, drawings, and claims.

BRIEF DESCRIPTION OF THE DRAWINGS

The invention may be more completely understood in reference to the following figures:

FIG. 3A depicts a cross-section view of an IC package according to the invention;

FIG. 3B depicts a top view of an IC package with the heat spreader removed according to the invention;

DETAILED DESCRIPTION OF THE PRIMARY EMBODIMENT

Figure 1:
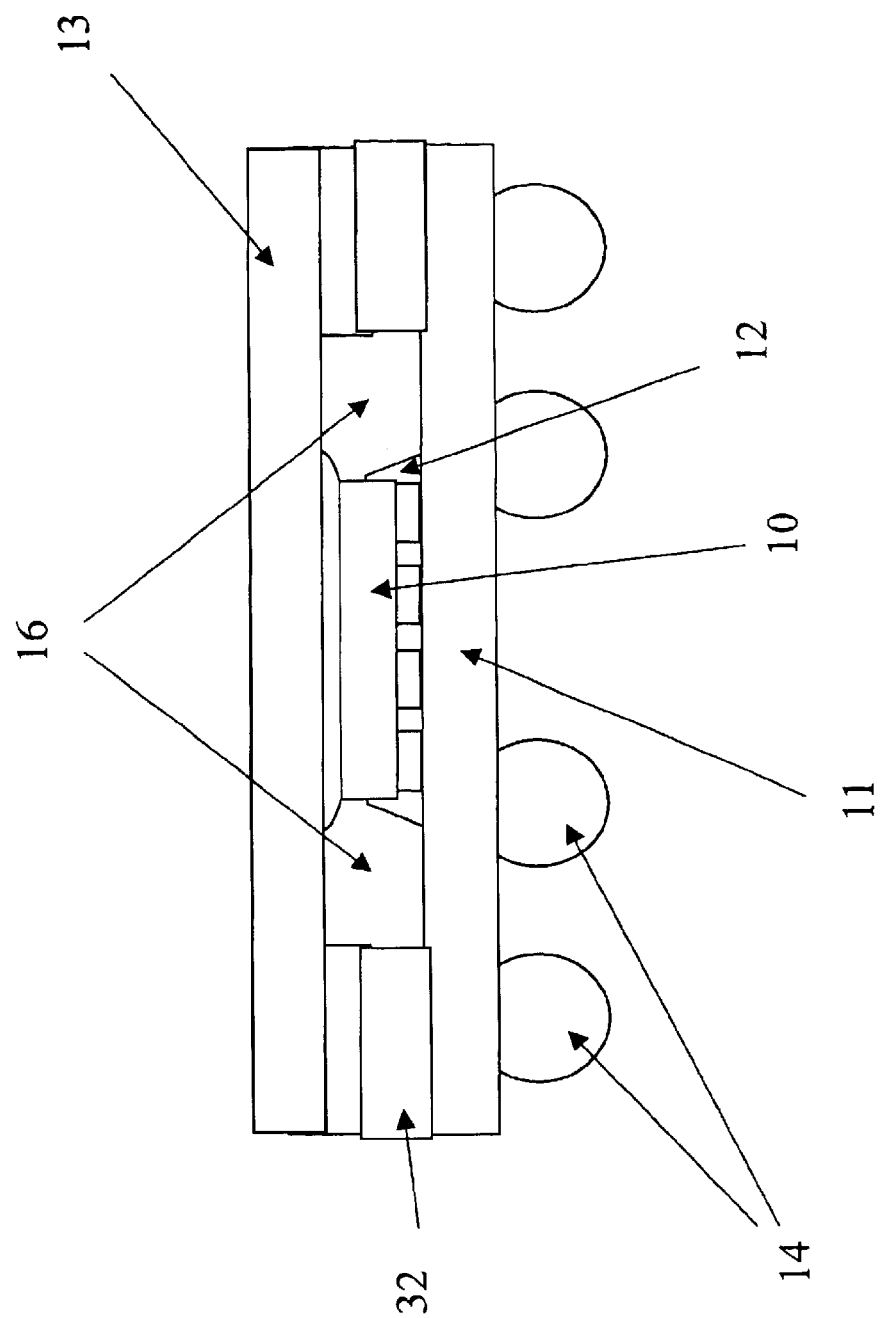
FIG. 1 depicts a prior art IC package.
Figure 2:
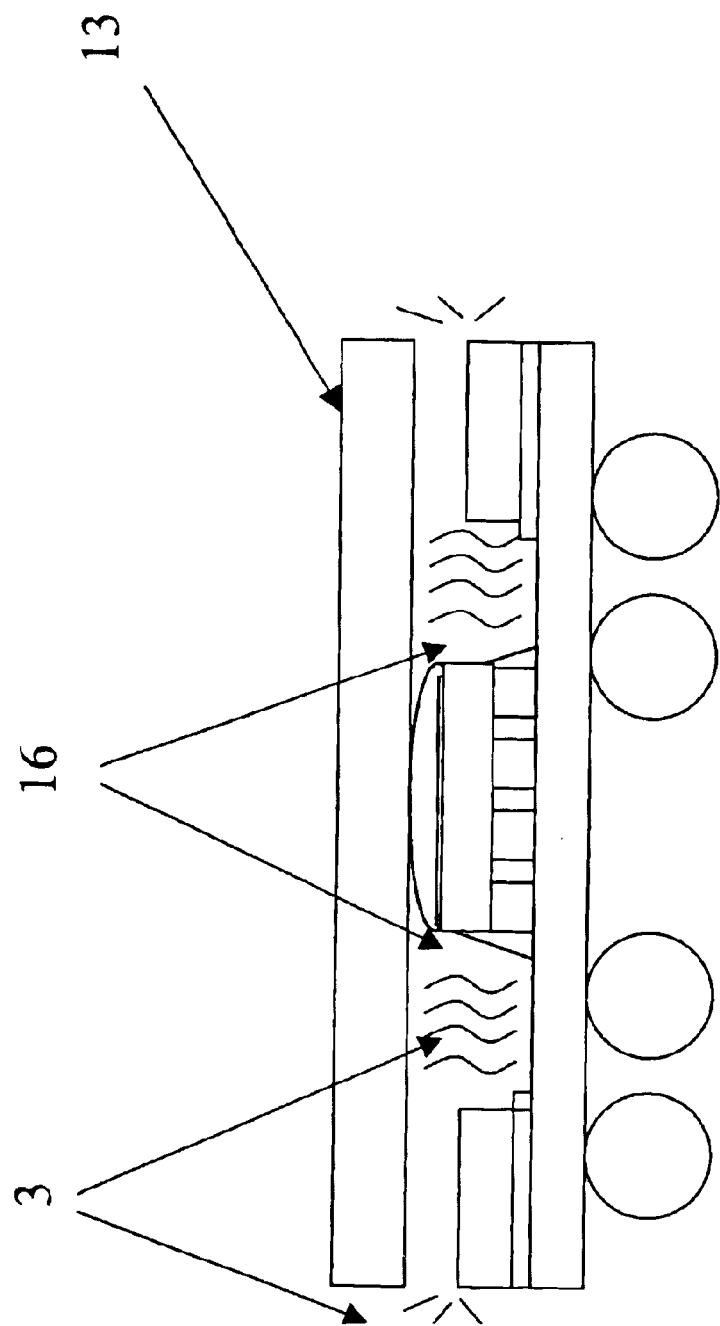
FIG. 2 depicts the prior art IC package subject to the popcorn effect due to moisture contained in several gaps within the IC package vaporizing and causing high vapor pressure.

FIG. 3A depicts a cross-section view of a flip-chip IC package 15 that compensates for the popcorn effect by allowing for the release of vapor 3 and vapor pressure from within gaps 16. Heat spreader 13 is attached to the IC package 15 using an adhesive layer 30 atop a stiffener layer 32. Adhesive layer 30 includes vias 31.

FIG. 3B is a top view of FIG. 3A with heat spreader 13 removed. Vias 31 are included in adhesive layer 30 during the package assembly process, as will be further explained in reference to FIG. 4. Vias 31 expose vapors 3 trapped in gaps 16 to the ambient environment and allow their release during initial temperature elevation (i.e., during solder reflow), when the IC package is subjected to further process steps, as well as during temperature elevations resulting from the operation of the chip 10. Vias 31 will not likely be blocked during subsequent process steps, as they extend laterally through adhesive layer 30, and will not be closed by subsequent layers stacked atop the IC package 15. Thus, vias 31 prevent a buildup of pressure in gaps 16 throughout the lifespan of the IC package.

Figure 4:
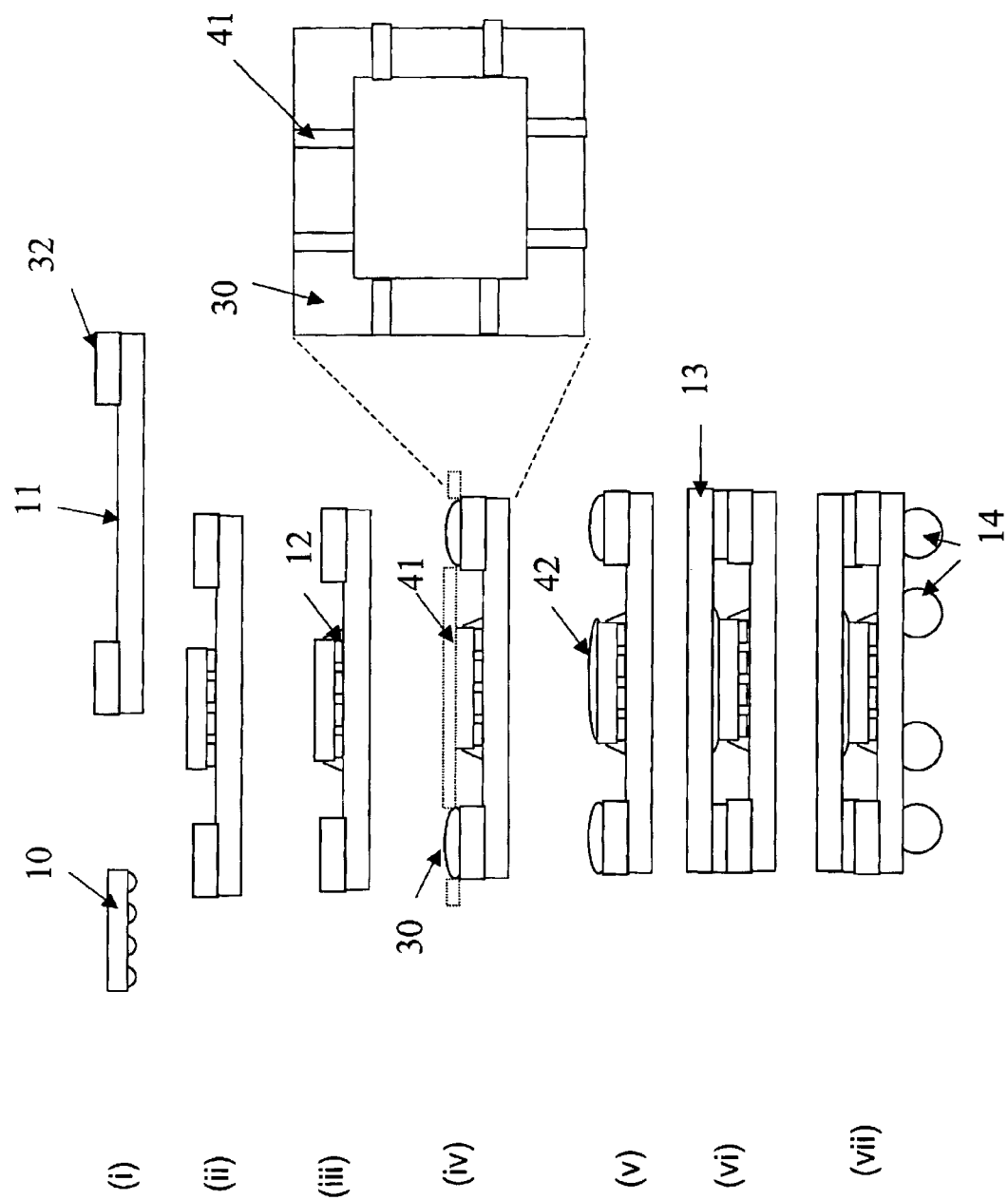
FIGS. 4i–4vii depicts a method of manufacturing an IC package according to the invention.

FIG. 4 depicts a method of manufacturing IC package 15 including vias 31. In step (i), a bumped chip 10 and a substrate 11 (including a stiffener layer 32 for receiving superceding layers) are provided. Bumped chip 10 can also be more than one chip. Substrate 11 can be made of plastic, flex, automated bonding tape, a leadframe, or any other substance generally known in the art of IC package manufacturing. In step (ii), bumped chip 10 is attached to substrate 11 and bonded thereto using an underfilling layer 12, such as plastic material, in step (iii).

In step (iv), a stencil 41 is used to create a pattern for the dispensing of structural adhesive layer 30. Stencil 41 provides that adhesive 30 will be dispensed on stiffener layer 32 such that moisture vias 31 will be created to allow vapors trapped in gaps 16 by superceding layers to escape to the ambient environment. Structural adhesive layer 30 is dispensed over stencil 41 by any means known in the IC package art.

In step (v), stencil 41 is removed by any means known in the IC package art, leaving structural adhesive layer 30 dispensed in a pattern that will generate vias 31. After removal of stencil 41, a layer of thermal adhesive is dispensed atop chip 10 using any means known in the IC package art.

Figure 5:
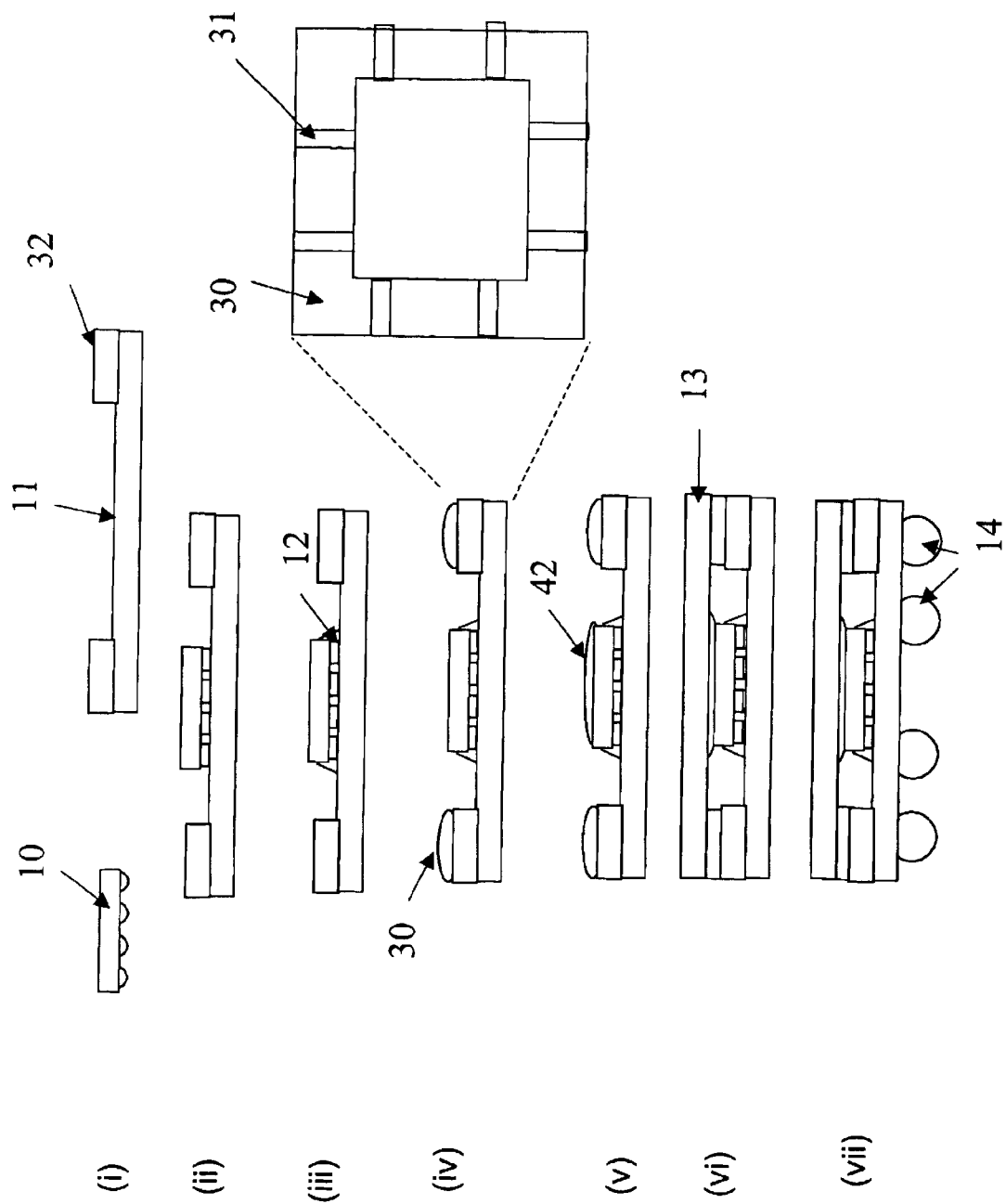
FIGS. 5i–5vii depicts a method of manufacturing an IC package including discrete dispensing of an adhesive layer.

As an alternative to utilizing stencil 41 in steps (iv) and (v), discrete printing can be employed whereby structural adhesive layer 30 is dispensed in discrete locations to form vias 31. FIG. 5 depicts such a discrete dispensing.

Heat spreader 13 is attached to IC package 15 atop structural adhesive layer 30 and thermal adhesive layer 42 such that vias 31 remain unobstructed and exposed to the ambient environment in step (vi).

In step (vii), solder balls 14 are attached to the underside of substrate 11. During solder reflow, any vapor trapped in gaps 16 either as moisture during process steps (i)–(vii) which vaporizes upon heating, or vapor resulting from solder vapor passing through permeable substrate 11, is released through vias 31 into the ambient environment, thereby preventing popcorn effect.

Figure 6:
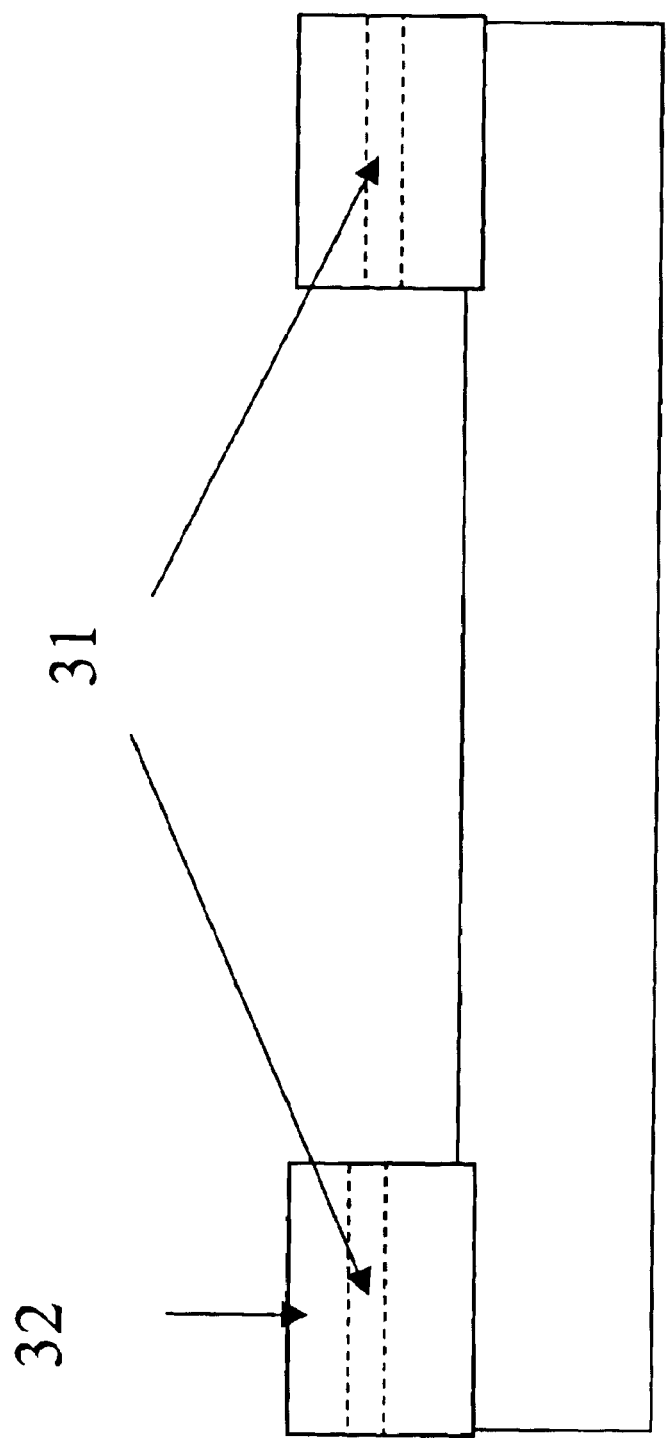
FIG. 6 depicts a cross-section view of an IC package according to another embodiment of the invention.

FIG. 6 depicts another embodiment of the invention where the IC package includes vias 31 incorporated in stiffener layer 32.

The preceding expressions and examples are exemplary and are not intended to limit the scope of the claims which follow.

What is claimed is:

1. A method of manufacturing an integrated circuit package comprising the steps of:

attaching a semiconductor chip to a substrate which includes stiffener;

dispensing an adhesive layer atop the stiffener; and attaching a heat spreader to the stiffener using the adhesive layer;

wherein the step of dispensing the adhesive layer further comprises the step of generating at least one via by dispensing the adhesive layer in a pattern which permits releasing vapor trapped in the integrated circuit package after the attachment of the heat spreader.

2. The method of claim 1, wherein the at least one via allows the release of vaporized moisture during solder reflow.

3. The method of claim 2, wherein the release of vapor occurs when vapor pressure in gaps 16 exceeds ambient vapor pressure during temperature elevation during solder reflow.

4. The method of claim 2, wherein the release of vapor occurs continuously in the course of solder reflow.

5. The method of claim 1, wherein the step of generating at least one via further comprises generating at least one via that extends laterally through the adhesive layer between the heat spreader and the stiffener.

6. The method of claim 5, wherein the step of generating at least one via further comprises generating at least one via that extends through the integrated circuit package to an exposed side exterior surface.

7. The method of claim 1, wherein the step of generating at least one via further comprises using a stencil to create the pattern which permits releasing vapor after the attachment of the heat spreader.

8. The method of claim 1, wherein the step of generating at least one via further comprises discretely dispensing the adhesive to create the pattern which permits releasing vapor after attachment of the heat spreader.

9. A method of manufacturing an integrated circuit package comprising the steps of:

attaching a semiconductor chip to a substrate which includes stiffener;

dispensing a first adhesive layer atop the stiffener;

dispensing a second adhesive layer atop the semiconductor chip; and attaching a heat spreader to the stiffener and semiconductor chip using first and second adhesive layers;

wherein the step of dispensing the first adhesive layer further comprises the step of generating at least one via by dispensing the first adhesive layer in a pattern which permits releasing vapor trapped in the integrated circuit package after the attachment of the heat spreader.

10. The method of claim 9, wherein the first adhesive layer comprises a structural adhesive layer and the second adhesive layer comprises a thermal adhesive layer.

* * * * *